(12) United States Patent
Choi et al.

(10) Patent No.: US 12,419,146 B2
(45) Date of Patent: Sep. 16, 2025

(54) LIGHT EMITTING DIODE PACKAGE

(71) Applicant: SEOUL SEMICONDUCTOR CO., LTD., Ansan-si (KR)

(72) Inventors: Seung Ri Choi, Ansan-si (KR); Hyuck Jun Kim, Ansan-si (KR); Se Min Bang, Ansan-si (KR); Do Choul Woo, Ansan-si (KR); Se Won Tae, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 18/626,684

(22) Filed: Apr. 4, 2024

(65) Prior Publication Data

US 2024/0313174 A1 Sep. 19, 2024

Related U.S. Application Data

(63) Continuation of application No. 17/724,864, filed on Apr. 20, 2022, now Pat. No. 11,978,837, which is a
(Continued)

(30) Foreign Application Priority Data

Aug. 21, 2017 (KR) .......... 10-2017-0105644
Jan. 12, 2018 (KR) .......... 10-2018-0004648

(51) Int. Cl.
*H10H 20/854* (2025.01)
*H01L 25/075* (2006.01)
(Continued)

(52) U.S. Cl.
CPC .......... *H10H 20/854* (2025.01); *H10H 20/83* (2025.01); *H10H 20/851* (2025.01);
(Continued)

(58) Field of Classification Search
CPC .. H10H 20/854; H10H 20/853; H10H 20/851; H10H 20/857; H10H 20/83;
(Continued)

(56) References Cited

U.S. PATENT DOCUMENTS 9,065,031 B2 * 6/2015 Katoh .................. H01L 33/62
10,615,321 B2 4/2020 Choi et al.
(Continued)

FOREIGN PATENT DOCUMENTS

CN 101276873 A 10/2008
CN 106463470 A 2/2017
(Continued)

OTHER PUBLICATIONS

Office Action(s) from corresponding Chinese Patent Application No. 201810586507.8 (Jan. 12, 2024).
(Continued)

*Primary Examiner* — Bo B Jang
(74) *Attorney, Agent, or Firm* — Perkins Coie LLP

(57) ABSTRACT

A light emitting module unit includes a circuit board and a light emitting device. The light emitting device includes a plurality of light emitting elements electrically coupled through the circuit board, one or more electrodes arranged on a first surface of the plurality of light emitting elements, a surface barrier formed on a second surface of one or more of the plurality of light emitting elements, and an encapsulation portion disposed above a third surface of the plurality of light emitting elements. The surface barrier is disposed between the encapsulation portion and the second surface of one or more of the plurality of light emitting elements.

20 Claims, 11 Drawing Sheets

Related U.S. Application Data continuation of application No. 17/086,736, filed on Nov. 2, 2020, now Pat. No. 11,335,837, which is a continuation of application No. 16/670,778, filed on Oct. 31, 2019, now Pat. No. 10,825,969, which is a continuation of application No. 15/974,612, filed on May 8, 2018, now Pat. No. 10,615,321.

(51) Int. Cl.
| | | |
|---|---|---|
| *H10H 20/83* | (2025.01) | |
| *H10H 20/85* | (2025.01) | |
| *H10H 20/851* | (2025.01) | |
| *H10H 20/853* | (2025.01) | |
| *H10H 20/856* | (2025.01) | |
| *H10H 20/857* | (2025.01) | |
| *H10H 20/858* | (2025.01) | |

(52) U.S. Cl.
CPC ........ *H10H 20/853* (2025.01); *H10H 20/856* (2025.01); *H10H 20/857* (2025.01); *H10H 20/858* (2025.01); *H01L 25/0753* (2013.01); *H10H 20/8506* (2025.01)

(58) Field of Classification Search
CPC ............... H10H 20/858; H10H 20/856; H10H 20/8506; H01L 25/0753
See application file for complete search history.

(56) References Cited

U.S. PATENT DOCUMENTS

| | | | |
|---|---|---|---|
| 10,825,969 | B2 | 11/2020 | Choi et al. |
| 11,335,837 | B2 | 5/2022 | Choi et al. |
| 2008/0048203 | A1 | 2/2008 | Son |
| 2009/0294780 | A1 | 12/2009 | Chou et al. |
| 2010/0090231 | A1 | 4/2010 | Jung et al. |
| 2014/0238243 | A1 | 8/2014 | Jardine et al. |
| 2015/0034979 | A1 | 2/2015 | Lee et al. |
| 2016/0126209 | A1 | 5/2016 | Hinata |
| 2017/0148718 | A1 | 5/2017 | Morita |
| 2019/0058095 | A1 | 2/2019 | Choi et al. |
| 2020/0066950 | A1 | 2/2020 | Choi et al. |
| 2021/0050492 | A1 | 2/2021 | Choi et al. |
| 2022/0246808 | A1 | 8/2022 | Choi et al. |

FOREIGN PATENT DOCUMENTS

| | | |
|---|---|---|
| CN | 106558597 A | 4/2017 |
| CN | 108807639 A | 11/2018 |
| JP | 2008277782 A | 11/2008 |
| JP | 2013110210 A | 6/2013 |
| JP | 2015207754 A | 11/2015 |
| JP | 2015220426 A | 12/2015 |
| JP | 2016001697 A | 1/2016 |
| KR | 1020130110131 A | 10/2013 |
| TW | 201721912 A | 6/2017 |

OTHER PUBLICATIONS

Office Action(s) from corresponding Chinese Patent Application No. 201911391399.X (Jan. 13, 2024).
English translation of Office Action from corresponding Japanese Patent Application No. 2018113526 dated Oct. 12, 2022 (6 pages).
Office Action {6 pages} and Search Report {1 page} issued in corresponding TW Application 107129035, issued Jul. 15, 2022.

* cited by examiner

LIGHT EMITTING DIODE PACKAGE

CROSS-REFERENCE TO RELATED APPLICATIONS

This application is a continuation of U.S. patent application Ser. No. 17/724,864, filed on Apr. 20, 2022, which is a continuation of U.S. patent application Ser. No. 17/086,736, filed on Nov. 2, 2020, which is a continuation of U.S. patent application Ser. No. 16/670,778, filed on Oct. 31, 2019, which is a continuation of U.S. patent application Ser. No. 15/974,612, filed on May 8, 2018, which claims priority to and benefit of Korean Patent Application No. 10-2017-0105644, filed on Aug. 21, 2017, and Korean Patent Application No. 10-2018-0004648, filed on Jan. 12, 2018. The aforementioned applications are incorporated herein by reference in their entireties.

TECHNICAL FIELD

This patent document relates to a light emitting diode package including a side-view light emitting diode package.

BACKGROUND

Generally, light emitting diode packages can be classified into top type light emitting diode packages and side-view light emitting diode packages. A side-view light emitting diode package is generally used as a light source for a backlight unit of a display apparatus, which emits light toward a side surface of a light guide plate.

SUMMARY

According to one or more embodiments of the present disclosure, a light emitting module unit includes a circuit board and a light emitting device. The light emitting device includes a plurality of light emitting elements electrically coupled through the circuit board, one or more electrodes arranged on a first surface of the plurality of light emitting elements, a surface barrier formed on a second surface of one or more of the plurality of light emitting elements, and an encapsulation portion disposed above a third surface of the plurality of light emitting elements. The surface barrier is disposed between the encapsulation portion and the second surface of one or more of the plurality of light emitting elements.

In at least one variant, the light emitting device further includes a wavelength converter arranged on the third surface of each of the plurality of light emitting elements and the encapsulation portion covers the wavelength converter and the plurality of light emitting elements.

In another variant, the encapsulation portion includes an epoxy resin or a silicone resin for sealing.

In another variant, the light emitting module unit further includes a housing that includes the circuit board and the light emitting device;

In another variant, the light emitting device further includes a wavelength converter arranged on each of the plurality of light emitting elements and the encapsulation portion fills in a space of the housing that is not covered by the wavelength converter.

In another variant, the surface barrier includes $SiO_2$ or $TiO_2$.

In another variant, the surface barrier includes a smoother surface than a surface of a light emitting element of the plurality of light emitting elements such that a material for the encapsulation portion flows along the surface of the surface barrier.

In another variant, the encapsulation portion and the surface barrier form a dual structure for blocking penetration of moisture and dust to the plurality of light emitting elements.

According to one or more embodiments of the present disclosure, a light emitting module unit includes a circuit board, a plurality of electrodes formed on one surface of the circuit board, and a plurality of light emitting elements. A light emitting element of the plurality of light emitting elements includes a light emitting structure electrically coupled to the circuit board and including Group III-V based semiconductors, an encapsulation portion covering an upper surface of the light emitting element, and a reflective layer disposed on a side surface of the light emitting structure of the light emitting element and configured to reflect light emitted through the side surface of the light emitting structure. The reflective layer is disposed between the light emitting structure and the encapsulation portion. The reflective layer is formed of a material having high thermal conductivity and reflectivity.

In at least one variant, the reflective layer further includes a single layer structure.

In another variant, the reflective layer further includes a multilayer structure including at least one of Ag, Al, Ni, Ti, a distributed Bragg reflector, or an omnidirectional reflector.

In another variant, at least two electrodes among the plurality of electrodes are formed on a lower surface of the light emitting structure. The light emitting structure further includes an n-type semiconductor layer, an active layer and a p-type semiconductor layer.

In another variant, the light emitting module unit further includes a first pad and a second pad arranged on an opposite surface of the circuit board to which the at least two electrodes are arranged. The first pad and the second pad are electrically connected to the at least two electrodes via at least two via-holes formed in the circuit board.

In another variant, the second pad is electrically connected to at least two light emitting elements to act as a common electrode.

In another variant, the plurality of light emitting elements further include a first light emitting element and a second light emitting element arranged side by side. The light emitting module unit further includes a first pad, a second pad, and a third pad arranged on an opposite surface of the circuit board to which the plurality of electrodes are arranged. The first light emitting element is electrically coupled to the first pad and the second pad via a first via-hole and the second light emitting element is electrically coupled to the second pad and the third pad via a second via-hole.

In another variant, the first light emitting element operates individually or independently of the second light emitting element.

In another variant, the first light emitting element emits a first color and the second light emitting element emits a second color different from the first color.

According to one or more embodiments of the present disclosure, a light emitting module unit includes a plurality of electrodes and a light emitting element. The light emitting element includes a light emitting structure including Group III-V based semiconductors, an encapsulation portion covering an upper surface of the light emitting element, and a reflective layer disposed on a side surface of the light emitting structure of each light emitting element. The reflective layer is disposed between the light emitting structure and the encapsulation portion, and the reflective layer reflects the light emitted through the side surface of the light emitting structure.

In at least one variant, the encapsulation portion includes a wavelength converter and fills in a space on and above the light emitting element.

In another variant, the reflective layer is disposed between the light emitting structure and the encapsulation portion, and the reflective layer is formed of a material having high thermal conductivity and reflectivity. The reflective layer is configured to reflect light emitted through the side surface of the light emitting structure.

In another variant, the light emitting module unit further includes a circuit board and a housing formed on the circuit board. The housing is configured to house at least two light emitting elements. The at least two light emitting elements operable to emit light of different colors. The at least two light emitting elements are electrically coupled to a plurality of pads arranged on an opposite surface of the circuit board via a plurality of via-holes.

Exemplary embodiments described in the present document provide a side-view light emitting diode package that can be tightly coupled to an exterior substrate.

In one embodiment, a light emitting diode package includes an upper housing and a lower housing. The upper housing includes a first light emitting diode (LED) chip arranged therein, a second LED chip arranged to be spaced apart from the first LED chip in a first direction, two light discharge structures, each light discharge structure corresponding to an upper surface of each LED chip and emitting light from each LED chip therethrough, first electrodes formed on a lower surface of the first LED chip, and second electrodes formed on a lower surface of the second LED chip. The lower housing includes at least three grooves at a lower surface thereof. A first groove corresponds to the first LED chip, a second groove corresponds to the second LED chip, and a third groove is arranged between the first groove and the second groove in the first direction. The lower housing further includes three or more pads, each pad corresponding to each groove and covering at least a portion of each groove, a first pair of via-holes and a second pair of via-holes. The first pair of via-holes are arranged to connect the first electrodes to one or more of the pads in a second direction perpendicular to the first direction. The second pair of via-holes are arranged to connect the second electrodes to one or more of the pads in the second direction. The third groove is formed at a position between one of the first pair of via-holes and one of the second pair of via-holes.

In some embodiments, the first pair of via-holes face each other over the first groove. The second pair of via-holes face each other over the second groove. One of the first pair of via-holes is connected to one of the pads and the other of the first pair of via-holes is connected to a different pad.

In some embodiments, a distance between two facing ends of the two light discharge structures is smaller than a distance between one of the first pair of via-holes and one of the second pair of via-holes, one of the first pair of via-holes facing one of the second pair of via-holes over the third groove. In some embodiments, a distance from one end of the light discharge structure to one of sidewalls of the upper housing is smaller than a distance from one of the second pair of via-holes to one of sidewalls of the lower housing.

In some embodiments, one end of the light discharge structure is proximate to one of the sidewalls of the upper housing, and one end of the second pair of via-holes is proximate to one of the sidewalls of the lower housing. In some embodiments, a protective layer is arranged between two adjacent pads.

In another embodiment, a light emitting diode package includes a first LED chip structure and a second LED chip structure. The first LED chip structure includes a first LED chip, a first wavelength converter arranged on an upper surface of the first LED chip; and a first pair of electrodes arranged on a lower surface of the LED chip. The second LED chip structure includes a second LED chip, a second wavelength converter arranged on an upper surface of the second LED chip, and a second pair of electrodes arranged on a lower surface of the LED chip. The light emitting diode package further includes an upper housing comprising the first LED chip structure and the second LED chip structure arranged side by side with a predetermined space interposed therebetween, a set of grooves comprising a first groove associated with the first LED chip structure, a second groove associated with the second LED chip structure, and a third groove disposed between the first groove and the second groove. The light emitting diode package further includes a first set of via-holes connecting the first LED chip structure to a first pad and a second pad, a second set of via-holes connecting the second LED chip structure to the second pad and a third pad, and a lower housing comprising the set of grooves formed at a lower surface, the first set of via-holes and the second set of via-holes.

In some embodiments, a distance between two different via-holes over the third groove is larger than a shortest distance between the first wavelength converter and the second wavelength converter. A distance from an inner surface of one sidewall of the upper housing to the second wavelength converter proximate to the one sidewall of the upper housing is smaller than a distance from an inner surface of one sidewall of the lower housing to one of the second set of via-holes proximate to the one sidewall of the lower housing.

In some embodiments, no groove is arranged in a space between one sidewall of the lower housing and one of the second set of via-holes proximate to the one sidewall of the lower housing. In some embodiments, no groove is formed between the other sidewall of the lower housing and one of the first set of via-holes proximate to the other sidewall of the lower housing.

In some embodiments, a shortest distance between the first and the second wavelength converters is smaller than a shortest distance between the first and the second LED chips. The light emitting diode package further includes a protective layer formed at the lower surface of the lower housing and partially overlaps with one or more pads.

In some embodiments, an outer surface of the one sidewall of the upper housing and an outer surface of the one sidewall of the lower housing are coplanar.

In accordance with one embodiment, a light emitting diode package includes: at least one light emitting diode chip; a housing on which the at least one light emitting diode chip is mounted, the housing being open at at least one surface thereof to allow light emitted from the at least one light emitting diode chip to be discharged through the open surface of the housing; and a plurality of pads disposed on a second surface of the housing different from a first surface of the housing through which light is discharged, the plurality of pads being electrically connected to the at least one light emitting diode chip, wherein the housing has a plurality of grooves formed on a third surface thereof adjacent to the second surface.

The pads may be formed at locations corresponding to the grooves, respectively, and each of the pads and the grooves may be coated with an electrically conductive material.

The at least one light emitting diode chip may include a light emitting structure emitting light, and first and second electrodes electrically connected to the light emitting structure, wherein the first and second electrodes may be electrically connected to the plurality of pads, respectively.

The at least one light emitting diode chip may include at least two light emitting diode chips, in which a first electrode of one of the at least two light emitting diode chips may be electrically connected to one of the plurality of pads, a second electrode of the other light emitting diode chip may be electrically connected to another pad, and the first electrode of one of the at least two light emitting diode chips may be electrically connected to the second electrode of the other light emitting diode chip.

The first and second electrodes may be electrically connected to the plurality of pads through a conductive material filling via-holes formed in the housing, respectively.

The pads may be separated a predetermined distance from each other so as to be electrically insulated from each other.

Each of the pads may be disposed so as to have a predetermined area on the second surface of the housing.

The grooves may be formed over the second surface of the housing on which the plurality of pads is disposed and the third surface thereof adjacent to the second surface thereof.

The grooves may be formed over the second surface of the housing on which the plurality of pads is disposed, the third surface thereof adjacent to the second surface thereof, and a fourth surface thereof adjacent to the third surface thereof.

The housing may be coupled to an exterior substrate such that the third surface of the housing adjoins the exterior substrate.

The housing may be coupled to the exterior substrate such that each of the plurality of pads can be electrically connected thereto via a solder.

The housing may be coupled to the exterior substrate such that the solder fills at least part of each of the plurality of grooves.

The light emitting diode package may further include a protective layer disposed between the pads to expose the grooves.

The protective layer may cover at least part of the pads.

The solder may be deposited on the pads exposed through the protective layer.

The light emitting diode package may further include a reflective layer surrounding a side surface of the light emitting diode chip and reflecting light emitted through the side surface of the light emitting diode chip.

The light emitting diode package may further include a wavelength converter disposed above the light emitting diode chip.

The light emitting diode package may further include a surface barrier disposed to surround a side surface of the light emitting diode chip and upper and side surfaces of the wavelength converter.

The light emitting diode package may further include a surface barrier disposed to surround upper and side surfaces of the light emitting diode chip.

The housing may have an inner wall concavely recessed toward an outer wall thereof.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 11 is a side sectional view of the light emitting diode package according to the seventh exemplary embodiment.

FIG. 12 is a side view of the light emitting diode package according to the seventh exemplary embodiment.

FIG. 13 is a rear view of the light emitting diode package according to the seventh exemplary embodiment.

DETAILED DESCRIPTION

Figure 1:
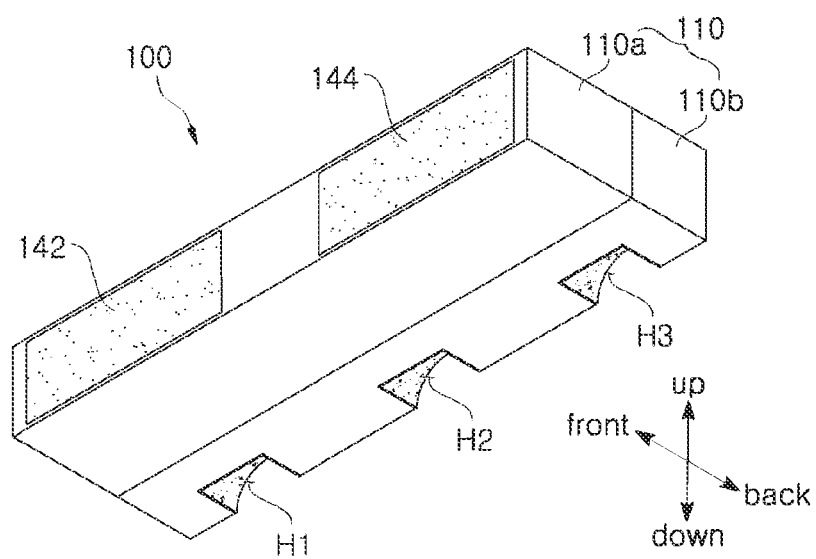
FIG. 1 is a perspective view of a light emitting diode package according to a first exemplary embodiment of the disclosed technology.

Exemplary embodiments will be described in more detail with reference to the accompanying drawings. The following embodiments are provided by way of example to facilitate the understanding of examples of the disclosed technology. In the drawings, widths, lengths, thicknesses, and the like of elements can be exaggerated for clarity and descriptive purposes. Throughout the specification, the same or like reference numerals denote the same or like elements.

Various implementations of the disclosed technology provide a light emitting diode package that has an improved coupling with an external substrate. In conventional light emitting diode packages, for example, side-view type light emitting diode packages, a light emitting diode chip is received in a cavity formed on an upper surface of a housing and is electrically connected to leads that extend to the outside of the housing through a lower surface of the housing. The side-view light emitting diode package is coupled to an exterior substrate via solders, which can make it difficult to achieve tight coupling between the light emitting diode package and the exterior substrate due to thickness thereof.

Figure 2:
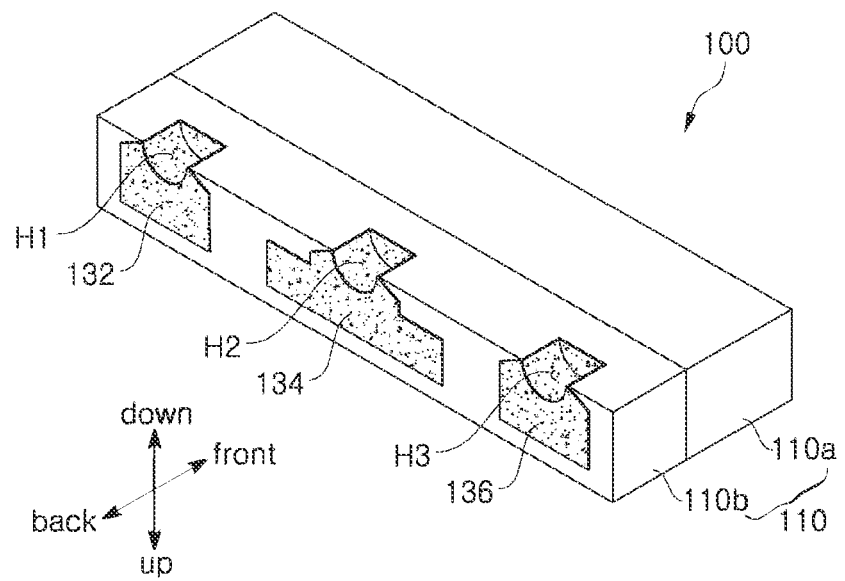
FIG. 2 is a rear perspective view of the light emitting diode package according to the first exemplary embodiment of the disclosed technology.
Figure 3A:
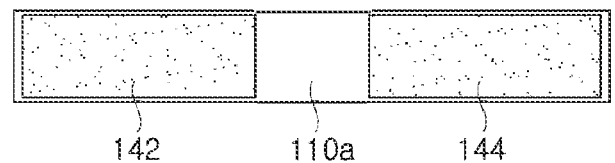
FIGS. 3A to 3C show front, side and rear views of the light emitting diode package according to the first exemplary embodiment of the disclosed technology.
Figure 3B:
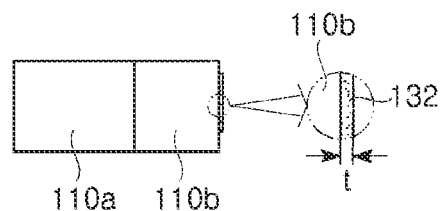
Figure 3C:
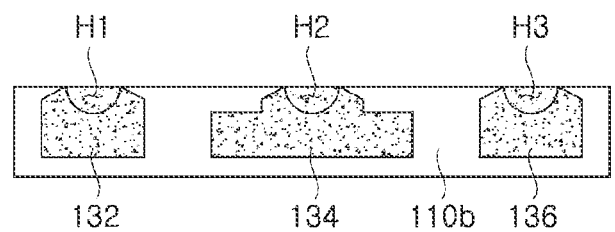
Figure 4:
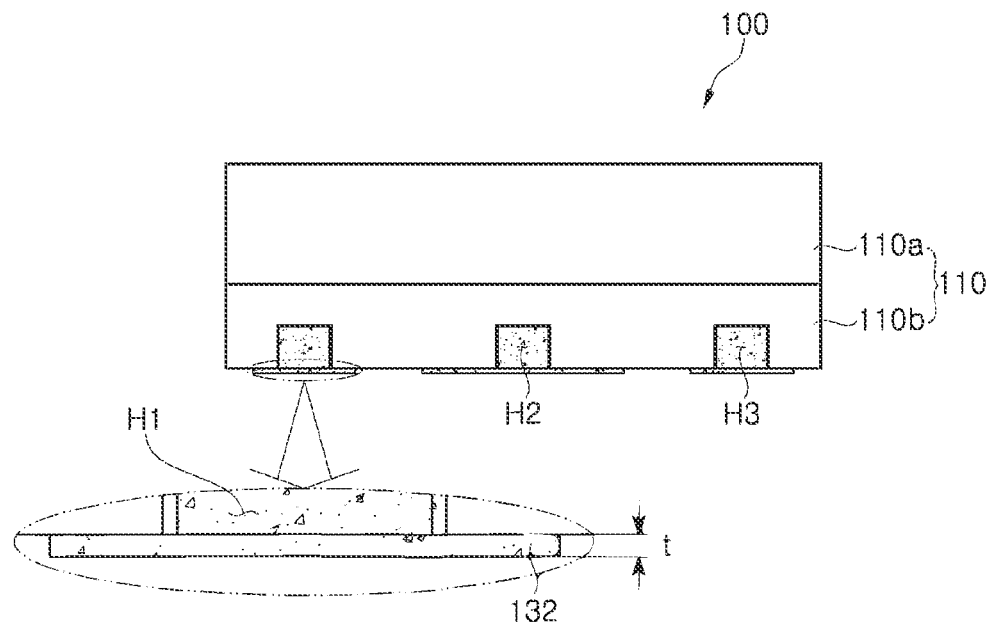
FIG. 4 is a side view of the light emitting diode package according to the first exemplary embodiment of the disclosed technology.

FIG. 1 is a perspective view of a light emitting diode package according to a first exemplary embodiment of the disclosed technology and FIG. 2 is a rear perspective view of the light emitting diode package according to the first exemplary embodiment of the disclosed technology. FIGS. 3A to 3C are front, side and rear views of the light emitting diode package according to the first exemplary embodiment of the disclosed technology, FIG. 4 is another side view of the light emitting diode package according to the first exemplary embodiment of the disclosed technology, and FIG. 5 is a cross-sectional view of the light emitting diode package according to the first exemplary embodiment of the disclosed technology.

The light emitting diode package 100 according to the first exemplary embodiment of the disclosed technology includes a housing 110, light emitting diode chips 120, first and second wavelength converters 142, 144, and first to third pads 132, 134, 136.

Figure 5:
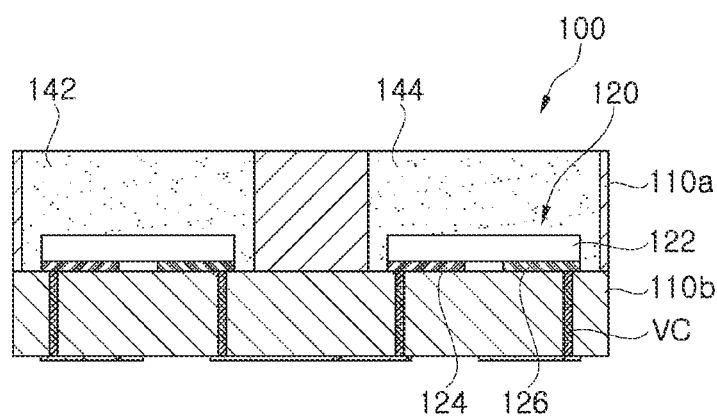
FIG. 5 is a cross-sectional view of the light emitting diode package according to the first exemplary embodiment of the disclosed technology.

As shown in FIG. 5, the housing 110 is formed to surround the light emitting diode chips 120. In this exemplary embodiment, the housing 110 includes an upper housing 110a and a lower housing 110b. Although the upper housing 110a may be integrally formed with the lower housing 110b, the following description will be given to each of the upper housing 110a and the lower housing 110b for convenience of description.

The housing 110 may be formed of or include a thermosetting material, such as EMC or white silicone, in order to improve light resistance and thermal resistance. The housing may also be formed of or include a thermoplastic material, for example, PA materials.

The housing 110 defines an outer appearance of the light emitting diode package 100. The upper housing 110a may have a surface open in one direction from a surface on which the light emitting diode chips 120 are mounted. For example, the upper housing 110a may have openings on its surface that faces the light emitting diode chips 120. Accordingly, light emitted from the light emitting diode chips 120 can be discharged through the open surface of the upper housing 110a. In this exemplary embodiment, the open surface of the upper housing 110a faces in a front direction thereof, as shown in FIG. 1.

In this exemplary embodiment, the lower housing 110b may be provided at a lower portion thereof with first to third pads 132, 134, 136 to be coupled to an exterior substrate. The first to third pads 132, 134, 136 may be coupled to the exterior substrate via a solder to be electrically connected to the exterior substrate. In this exemplary embodiment, the first to third pads 132, 134, 136 are formed at a back surface of the lower housing 110b, as shown in FIG. 1 and FIG. 2.

Further, the lower housing 110b may have first to third grooves H1, H2, H3 formed on a lower surface thereof. The first to third pads 132, 134, 136 may be located on the lower surface of the lower housing 110b to cover the first to third grooves H1, H2, H3, respectively. Referring to FIG. 2 that shows the rear perspective view of the exemplary light emitting diode package, the lower surface is at the top and the back surface is on the side. The first to third grooves H1, H2, H3 are formed at locations corresponding to the first to third pads 132, 134, 136 and may have a predetermined depth. Although the first to third grooves H1, H2, H3 are illustrated as having a semi-cylindrical shape in FIG. 1 and FIG. 2 in this exemplary embodiment, the grooves H1, H2, H3 may have various shapes. Further, each of the first to third grooves H1, H2, H3 formed on the lower surface of the lower housing 110b may be extended to be open at the back surface of the lower housing 110b. Thus, the first to third grooves H1, H2, H3 may be formed over the lower surface and the back surface of the lower housing 110b.

As described above, the first to third grooves H1, H2, H3 are placed corresponding to the first to third pads 132, 134, 136, respectively. In this exemplary embodiment, inner surfaces of the first to third grooves H1, H2, H3 and the first to third pads 132, 134, 136 may be plated (coated) with a conductive material such as a metal. With this structure, the first to third pads 132, 134, 136 may be electrically connected to the exterior substrate when coupled thereto via the solder.

Referring to FIG. 2 and FIG. 3C, the first to third pads 132, 134, 136 may be formed on the back surface of the lower housing 110b with a predetermined shape and a predetermined size. Here, the first to third pads 132, 134, 136 may have various shapes, and may be separated a predetermined distance from one another so as to be electrically insulated from one another. For the reference, FIG. 2 shows the light emitting diode package in a front-to-back and upside-down state of the light emitting diode package shown in FIG. 1.

The first to third pads 132, 134, 136 are disposed in a backside region of the housing 110. In addition, the first to third grooves H1, H2, H3 are formed over the lower surface and the back surface of the housing 110 so as to be disposed in the regions of the first to third pads 132, 134, 136 on the back surface of the housing 110. Accordingly, the first to third grooves 132, 134, 136 are not exposed on a side surface of the housing 110.

Referring to FIG. 3B and FIG. 4, in this exemplary embodiment, the first to third pads 132, 134, 136 may be formed to a predetermined thickness 't' on the back surface of the lower housing 110b. That is, as described above, the first to third pads 132, 134, 136 may be coupled to the lower housing 110b by a conductive material such as a metal instead of being plated on the surface of the lower housing 110b. In some implementations, a plating may be additionally performed to improve electrical conductivity after the first to third pads 132, 134, 136 are coupled to the lower housing 110b.

Electrical connection between the light emitting diode chips 120 and the first to third pads 132, 134, 136 in this exemplary embodiment will be described with reference to FIG. 5. The light emitting diode chips 120 are received in accommodation spaces of the housing 110, each open at one side thereof, and the first and second wavelength converters 142, 144 may be disposed to cover the light emitting diode chips 120, respectively.

The first and second wavelength converters 142, 144 serve to allow the light emitting diode package 100 to emit white light through wavelength conversion of light emitted from the light emitting diode chip 120. To this end, each of the first and second wavelength converters 142, 144 may contain at least one type of phosphor.

Each of the light emitting diode chips 120 includes a light emitting structure 122 and first and second electrodes 124, 126 formed on a lower surface of the light emitting structure 122. The light emitting structure 122 includes an n-type semiconductor layer, an active layer and a p-type semiconductor layer, each of which includes Group III-V based semiconductors. By way of example, the n-type semiconductor layer, the active layer and the p-type semiconductor layer may include nitride semiconductors such as (Al, Ga, In)N. Further, the active layer may be interposed between the n-type semiconductor layer and the p-type semiconductor layer.

The n-type semiconductor layer may be a conductive semiconductor layer containing n-type dopants (for example, Si) and the p-type semiconductor layer may be a conductive semiconductor layer containing p-type dopants (for example, Mg). The active layer may include a multi-quantum well (MQW) structure and the composition ratio of the active layer may be determined to allow the light emitting diode chip to emit light having a desired peak wavelength.

The first and second electrodes 124, 126 may be electrically connected to the n-type semiconductor layer and the p-type semiconductor layer, respectively. In some implementations, the connection sequence therebetween can be changed.

The lower housing 110b may be formed with via-holes VC under the first and second electrodes 124, 126 at a location of the light emitting diode chip 120. Thus, the via-holes VC extend from the surface of the lower housing 110b, on which the light emitting diode chip 120 is mounted, to the back surface of the lower housing 110b. In addition, the first to third pads 132, 134, 136 are disposed on the back surface of the lower housing 110b and the via-holes VC may be filled with a conductive material. With this structure, the first and second electrodes 124, 126 of the light emitting diode chips 120 can be electrically connected to the first to third pads 132, 134, 136 on the back surface of the lower housing 110b by the conductive material filling the via-holes VC.

In this exemplary embodiment, the light emitting diode package 100 includes two light emitting diode chips 120 that are arranged along a direction parallel to a surface of the lower housing 110b. Thus, referring to FIG. 3, the first pad 132 is electrically connected to the first electrode 124 of the light emitting diode chip 120 disposed at the left side of the light emitting diode package and the second pad 134 is electrically connected to the second electrode 126 of the light emitting diode chip 120 disposed at the left side of the light emitting diode package. In addition, the second pad 134 is electrically connected to the first electrode 124 of the light emitting diode chip 120 disposed at the right side of the light emitting diode package and the third pad 136 is electrically connected to the second electrode 126 of the light emitting diode chip 120 disposed at the right side of the light emitting diode package. That is, the second pad 134 is electrically connected to the two light emitting diode chips 120 to act as a common electrode, which electrically connects the two light emitting diode chips 120 to each other in series.

In addition, with the two light emitting diode chips 120 disposed in the upper housing 110a, the upper housing 110a may have two open portions on a surfaces of the upper housing 110a. In some implementations, the two open portions may be located above the two light emitting diode chips 120, respectively, as shown in FIG. 1 and FIG. 3A. In this exemplary embodiment, the light emitting diode package 100 is illustrated as including the two light emitting diode chips 120. However, it should be understood that the number of light emitting diode chips 120 included in the light emitting diode package 100 is not limited thereto. The light emitting diode package 100 may include various numbers of light emitting diode chips 120. In this structure, the upper housing 110a may a surface with open portions disposed above the light emitting diode chips 120. The number of open portions of the surface of the upper housing 110a may be determined based on the number of light emitting diode chips 120. In some implementations, the number of open portions of the surface of the upper housing 110a may be same as the number of light emitting diode chips 120.

As described above, the first to third pads 132, 134, 136 are formed on the housing 110 of the light emitting diode package 100 and the first to third grooves H1, H2, H3 are formed at the locations of the housing 110 corresponding to the first to third pads 132, 134, 136 such that a solder can fill the first to third grooves H1, H2, H3 when the light emitting diode package 100 is coupled to the exterior substrate using the solder. Since the solder contacts the first to third pads 132, 134, 136 while filling the first to third grooves H1, H2, H3, the light emitting diode package 100 can be more closely coupled to the exterior substrate. For example, the light emitting diode package 100 can be closely coupled to the exterior substrate through the solder filled in the first to third grooves H1, H2, H3. In this exemplary embodiment, the surface of the light emitting diode package 100 adjoining the exterior substrate is a lower surface of the housing 110 where the first to third grooves H1, H2, H3 are formed.

In addition, the contact area between the solder and the light emitting diode package 100 through the first to third grooves H1, H2, H3 is increased. With this structure, the light emitting diode package 100 can be more firmly coupled to the exterior substrate.

Further, since the solder couples the light emitting diode package to the exterior substrate while filling the first to third grooves H1, H2, H3, the solder does not flow to the side surface of the light emitting diode package 100. Accordingly, in a structure wherein other light emitting diode chip 120 is disposed on the side surface of the light emitting diode chip 120, the light emitting diode package 100 can be coupled to the exterior substrate with a minimized distance between adjacent light emitting diode chips 120, without being obstructed by the solder connecting the light emitting diode chips 120 to the exterior substrate.

Figure 6:
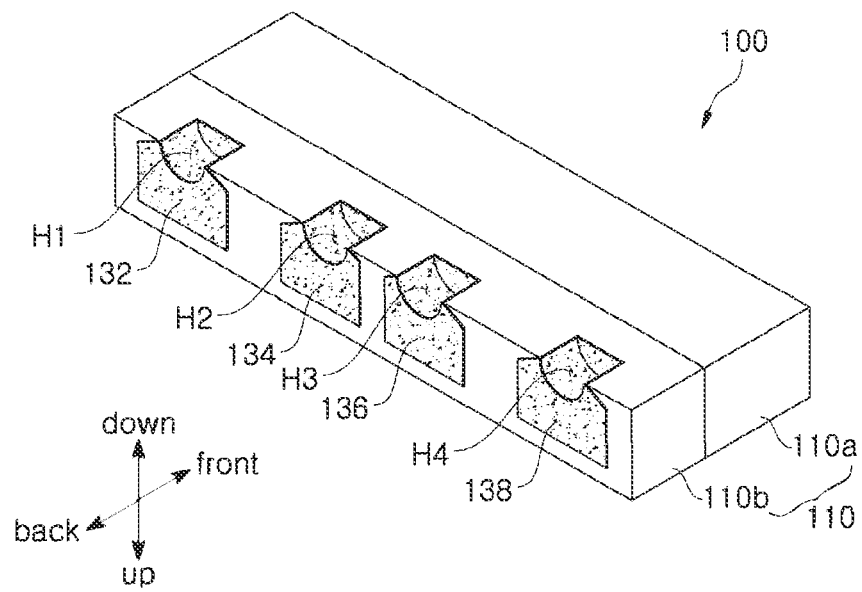
FIG. 6 is a perspective view of a light emitting diode package according to a second exemplary embodiment of the disclosed technology.

FIG. 6 is a perspective view of a light emitting diode package according to a second exemplary embodiment of the disclosed technology.

The light emitting diode package 100 according to the second exemplary embodiment includes a housing 110, light emitting diode chips 120, wavelength converters 140, and first to fourth pads 132, 134, 136, 138. In the following description, description of the same components as those of the first exemplary embodiment will be omitted.

In this exemplary embodiment, the first to fourth pads 132, 134, 136, 138 are formed on the lower surface of the lower housing 110b, as shown in FIG. 6. In addition, the lower housing 110b has first to fourth grooves H1, H2, H3, H4 at locations corresponding to the first to fourth pads 132, 134, 136, 138. The first to fourth pads 132, 134, 136, 138 may be separated from one another so as to be electrically insulated from each other.

Accordingly, one of two light emitting diode chips 120 may be electrically connected to the first and second pads 132, 134 and the other light emitting diode chip 120 may be electrically connected to the third and fourth pads 136, 138.

Figure 7:
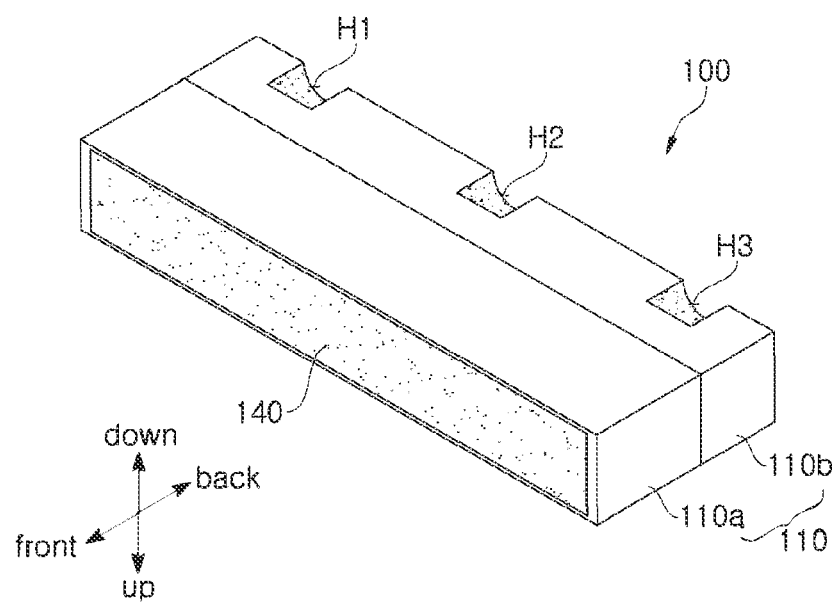
FIG. 7 is a perspective view of a light emitting diode package according to a third exemplary embodiment of the disclosed technology.

FIG. 7 is a perspective view of a light emitting diode package according to a third exemplary embodiment of the disclosed technology.

The light emitting diode package 100 according to the third exemplary embodiment includes a housing 110, a light emitting diode chip 120, a wavelength converter 140, and first to third pads 132, 134, 136.

In this exemplary embodiment, the light emitting diode package 100 includes one light emitting diode chip 120. Accordingly, the light emitting diode package 100 includes one wavelength converter 140 formed on a front surface thereof, as shown in FIG. 7. With this structure, the upper housing 110a may have a surface with a single open portion. Thus, the one light emitting diode chip 120 may be electrically connected to each of the first to third pads 132, 134, 136. Here, the second pad 134 can serve to couple the light emitting diode package 100 to an exterior substrate. Further, the second pad 134 may act to dissipate heat generated from the light emitting diode package 100.

In addition, the second pad 134 may be omitted, as needed. In this case, the second groove H2 may not be formed in the lower housing 110b.

Figure 8:
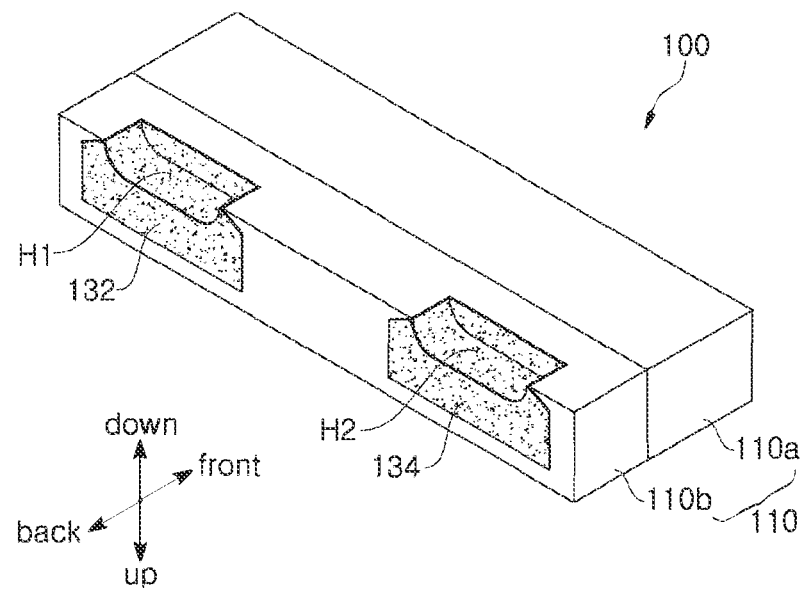
FIG. 8 is a perspective view of a light emitting diode package according to a fourth exemplary embodiment of the disclosed technology.

FIG. 8 is a perspective view of a light emitting diode package according to a fourth exemplary embodiment of the disclosed technology.

The light emitting diode package 100 according to the fourth exemplary embodiment includes a housing 110, light emitting diode chips 120, wavelength converters 140, and first and second pads 132, 134.

In this exemplary embodiment, the first and second pads 132, 134 may be disposed on the back surface of the housing 110 and the lower housing 110b has first and second grooves H1, H2 at locations corresponding to the first and second pads 132, 134. In this exemplary embodiment, the first and second grooves H1, H2 may have a relatively large size, unlike the first exemplary embodiment. For example, the first and second grooves H1, H2 may be formed to have a larger area on the lower surface of the lower housing 110b adjoining an exterior substrate than on the back surface thereof.

In this exemplary embodiment, each of the first and second grooves H1, H2 has a shape which has curved corners and a linear segment between the curved corners to form a relatively large space. With this structure, the first and second grooves H1, H2 can be filled with a relatively large amount of solders.

In the structure wherein the light emitting diode package according to this exemplary embodiment includes two light emitting diode chips 120 as in the first exemplary embodiment, these light emitting diode chips 120 may be connected to each other in series within the housing 110. In addition, the first electrode 124 of one of the two light emitting diode chips 120 may be electrically connected to the first pad 132 and the second electrode 126 of the other light emitting diode chip 120 may be electrically connected to the second pad 134.

In the structure wherein the light emitting diode package according to this exemplary embodiment includes one light emitting diode chip 120 as in the third exemplary embodiment, the first electrode 124 of the light emitting diode chip 120 may be electrically connected to the first pad 132 and the second electrode 126 thereof may be electrically connected to the second pad 134.

Figure 9:
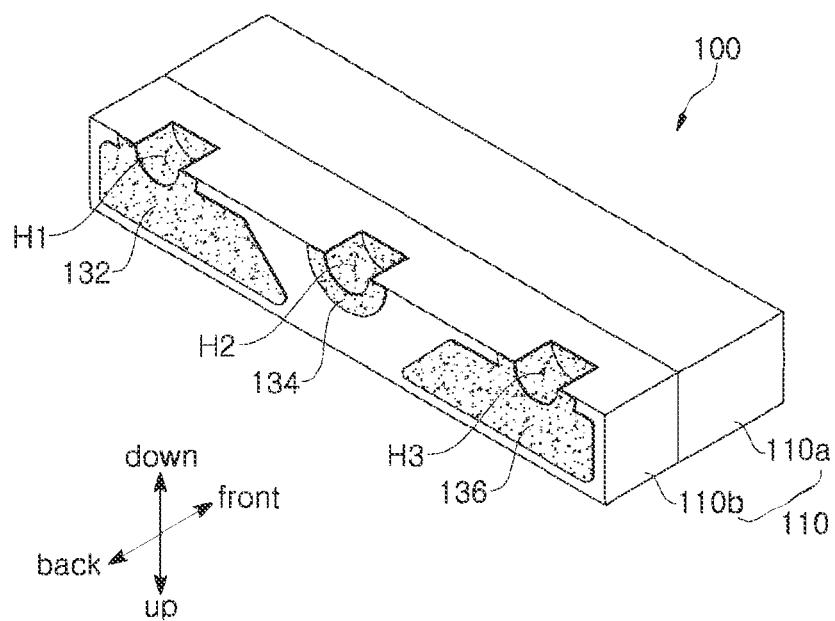
FIG. 9 is a perspective view of a light emitting diode package according to a fifth exemplary embodiment of the disclosed technology.

FIG. 9 is a perspective view of a light emitting diode package according to a fifth exemplary embodiment of the disclosed technology.

The light emitting diode package 100 according to the fifth exemplary embodiment includes a housing 110, light emitting diode chips 120, wavelength converters 140, and first to third pads 132, 134, 136. The light emitting diode package 100 according to this embodiment is a modification of the first to third pads 132, 134, 136 in the first exemplary embodiment and description of the same components as those of the first exemplary embodiment will be omitted.

In this exemplary embodiment, the second pad 134 may have a smaller area than the second pad of the first exemplary embodiment. In addition, the first and third pads 132, 136 may have a larger area than those of the first exemplary embodiment. As such, since the first and third pads 132, 136 have relatively large areas, a larger amount of solders can be provided between the exterior substrate and the first and third pads 132, 136 when coupling the exterior substrate to the light emitting diode package 100. Accordingly, the first and third pads 132, 136 electrically connected to the exterior substrate can be more firmly coupled to the exterior substrate than the second pad 134.

Furthermore, as in the first exemplary embodiment, the second pad 134 according to this exemplary embodiment may act as a common electrode, which electrically connects the two light emitting diode chips 120 to each other in series without electrical connection to the exterior substrate.

Figure 10:
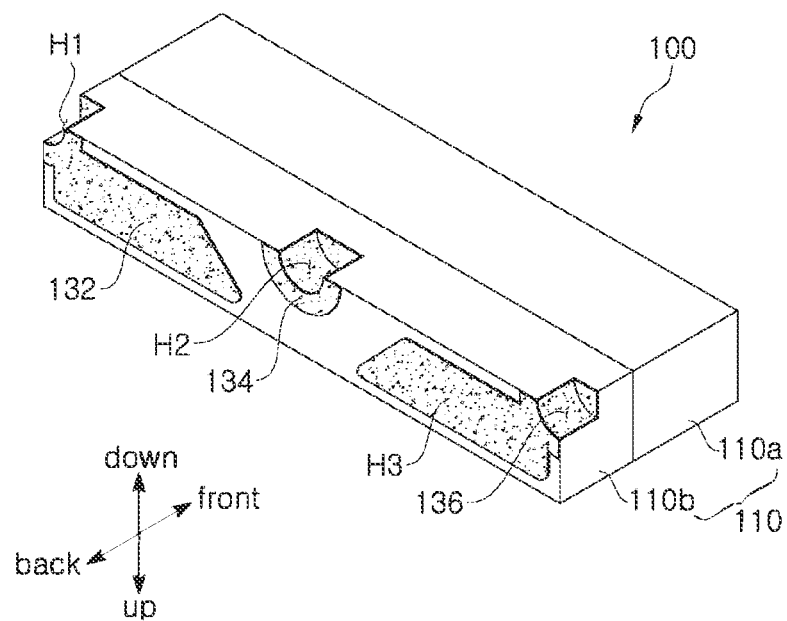
FIG. 10 is a perspective view of a light emitting diode package according to a sixth exemplary embodiment of the disclosed technology.

FIG. 10 is a perspective view of a light emitting diode package according to a sixth exemplary embodiment of the disclosed technology.

The light emitting diode package 100 according to the sixth exemplary embodiment includes a housing 110, light emitting diode chips 120, first and second wavelength converters 142, 144, and first to third pads 132, 134, 136. In the following description, description of the same components as those of the above exemplary embodiments will be omitted.

In this exemplary embodiment, the second pad 134 is the same as that of the fifth exemplary embodiment and thus description thereof will be omitted.

The first to third pads 132, 134, 136 are disposed on the back surface of the lower housing 110b and the first and third pads 132, 136 partially extend to a corner at which a lower surface of the lower housing 110b adjoins a side surface thereof. Further, in this exemplary embodiment, the lower housing 110b may have first to third grooves H1, H2, H3, in which the first and third grooves H1 and H3 are placed corresponding to the first and third pads 132, 136. Each of the first and third grooves H1, H3 may be formed over the lower surface and the back surface of the lower housing 110b. Thus, the first and third grooves H1, H3 may extend from the lower surface of the lower housing 110b to both corners thereof. Referring to FIG. 10, the first and third grooves H1, H3 may be located at the corners or nodes of the lower housing 110b at two opposite sides. In this implementation, the first and third grooves H1, H3 are formed over the lower surface, back surface, and the side surface of the lower housing 110b, while the second groove H2 is formed over the lower surface and the back surface of the lower housing 110b. In this exemplary embodiment, the first and third grooves H1, H3 are exposed on the side surface of the housing 110, unlike those of the light emitting diode packages of the above exemplary embodiments.

The structure of the first and third grooves H1, H3 formed at the corners of the lower housing 110b secures solderability upon coupling the light emitting diode package 100 to the exterior substrate via solders. As such, according to this exemplary embodiment, the first and third grooves H1, H3 are formed at the corners extending from the lower surface to the side surface of the lower housing 110b and the first and third pads 132, 136 are formed on the back surface of the lower housing 110b and connected to the first and third grooves H1, H3, whereby the light emitting diode package 100 can be more firmly coupled to the exterior substrate.

Figure 11:
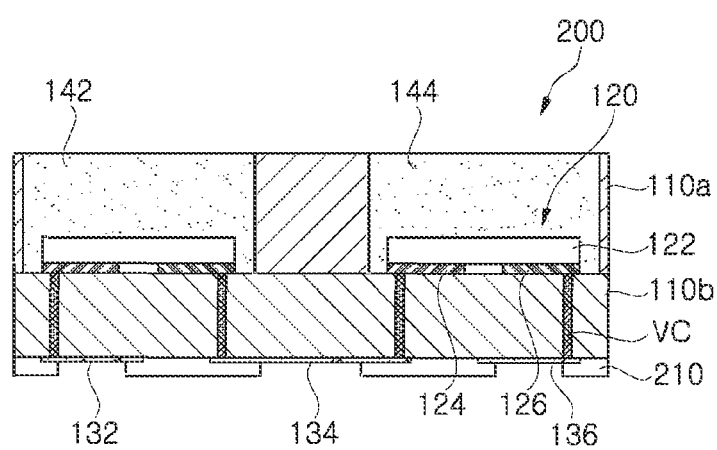
FIG. 11 to FIG. 13 illustrate a light emitting diode package according to a seventh exemplary embodiment of the disclosed technology, where
Figure 12:
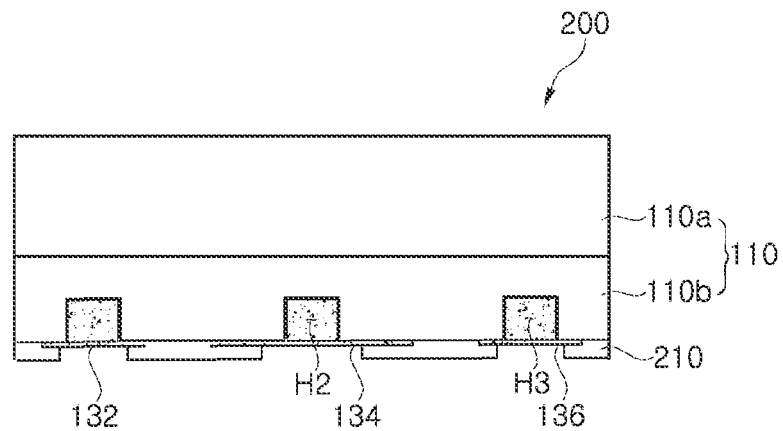
Figure 13:
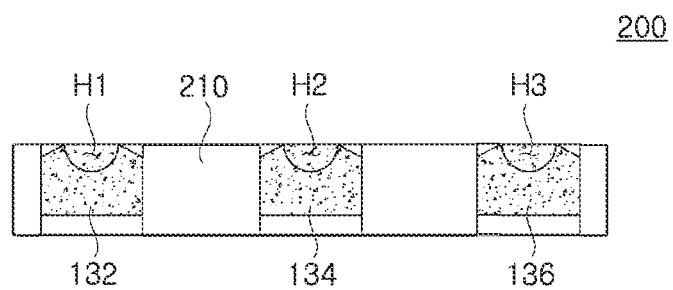

FIG. 11 to FIG. 13 are views of a light emitting diode package according to a seventh exemplary embodiment of the disclosed technology.

FIG. 11 is a side sectional view of the light emitting diode package according to the seventh exemplary embodiment. FIG. 12 is a side view of the light emitting diode package according to the seventh exemplary embodiment. FIG. 13 is a rear view of the light emitting diode package according to the seventh exemplary embodiment.

The light emitting diode package 200 according to the seventh exemplary embodiment includes a housing 110, light emitting diode chips 120, first and second wavelength converters 144, 144, first to third pads 132, 134, 136, and a protective layer 210. In the following description, description of the same components as those of the above exemplary embodiments will be omitted.

The protective layer 210 is formed on the back surface of the light emitting diode package 200. The protective layer 210 is disposed between the first pad 132, the second pad 134 and the third pad 136. In addition, the protective layer 210 may be formed to cover part of the first pad 132, the second pad 134 and the third pad 136, as shown in FIG. 11 and FIG. 12. The first to third pads 132, 134, 136 are exposed through spaces between the protective layers 210. Solders are supplied to the first pad 132 to the third pad 136 exposed by the protective layer 210.

In a structure wherein the light emitting diode package does not include the protective layer 210, there can be a problem of short circuit between the pads when excess solder is deposited on the first to third pads 132, 134, 136. Upon curing the solder for bonding the light emitting diode package 200 to a circuit board (not shown), large stress is generated from the first and third grooves H1, H3, on which a relatively large amount of solder is deposited. Accordingly, even when the housing 110 is attached to a circuit board 710 such that a front surface of the housing 110 becomes parallel to the circuit board 710, the housing 110 can be slanted by stress of the solder such that the front surface of the housing 110 becomes perpendicular to the circuit board.

The protective layer 210 restricts a region to be deposited with the solder, thereby preventing the first pad 132 to the third pad 136 from receiving excess solder. That is, the protective layer 210 can control the amount of solder to be deposited on the first pad 132 to the third pad 136 and the deposition location of the solders. Thus, the light emitting diode package 200 according to this exemplary embodiment can prevent short circuit between the pads and displacement of the housing 110 due to deposition of excess solder.

According to this exemplary embodiment, the light emitting diode package 200 may be configured such that the first pad 132 and the second pad 134 may be connected to power sources having different polarities. In this exemplary embodiment, one electrode of one of the two light emitting diode chips 120 is connected to another electrode of the other light emitting diode chip 120 by the second pad 134, in which the other electrode has a different polarity from the one electrode. That is, the two light emitting diode chips 120 can be connected to each other in series by the second pad 134. The light emitting diode package 200 allows simultaneous operation of the two light emitting diode chips 120. For a light emitting device such as a backlight unit including a plurality of light emitting diode packages 200, the plurality of light emitting diode packages 200 can be controlled through simple operation and a drive circuit for control can also be simplified.

In an alternative embodiment, the first pad 132 and the third pad 136 of the light emitting diode package 200 are connected to power sources having the same polarity. In this exemplary embodiment, an electrode of one of the two light emitting diode chips 120 is connected to an electrode of the other light emitting diode chip 120 by the second pad 134, in which both electrodes have the same polarity. In addition, the second pad 134 is connected to a power source having a different polarity than the first pad 132 and the third pad 136. That is, the two light emitting diode chips 120 can be connected to each other in parallel. In this exemplary embodiment, the light emitting diode package 200 allows individual operation of the two light emitting diode chips 120. Since the two light emitting diode chips 120 can be independently operated, it is possible to achieve easy control of color reproducibility, color temperature, brightness, and others. Further, defective light emitting diode chips 120 can be easily selected upon testing of the light emitting diode package 200.

Figure 14:
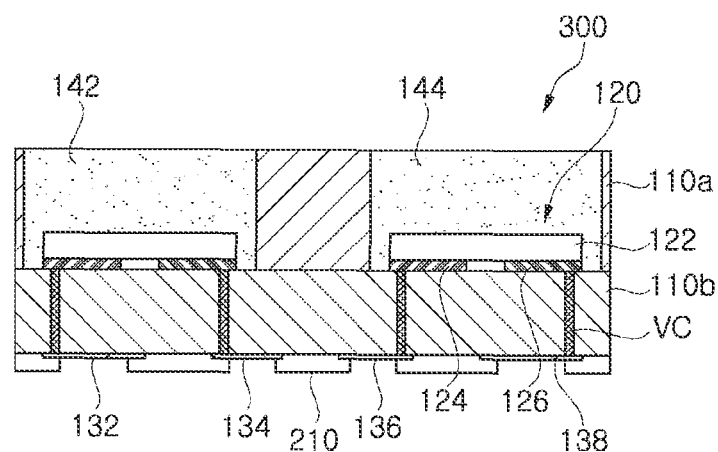
FIG. 14 is a sectional view of a light emitting diode package according to an eighth exemplary embodiment of the disclosed technology.

FIG. 14 is a sectional view of a light emitting diode package according to an eighth exemplary embodiment of the disclosed technology.

Referring to FIG. 14, the light emitting diode package 300 according to the eighth exemplary embodiment includes a housing 110, light emitting diode chips 120, first and second wavelength converters 142, 144, and first to fourth pads 132, 134, 136, 138. In the following description, description of the same components as those of the above exemplary embodiments will be omitted.

In this exemplary embodiment, the first to fourth pads 132, 134, 136, 138 are formed on the lower surface of the lower housing 110b. In addition, the lower housing 110b is formed with first to fourth grooves H1, H2, H3, H4 (see FIG. 6) at locations corresponding to the first to fourth pads 132, 134, 136, 138. The first to fourth pads 132, 134, 136, 138 may be separated from each other so as to be electrically insulated from each other.

With the structure of this exemplary embodiment, one of the two light emitting diode chips 120 may be electrically connected to the first and second pads 132, 132 and the other light emitting diode chip 120 may be electrically connected to the third and fourth pads 136, 138. That is, the two light emitting diode chips 120 can be individually operated.

The first wavelength converter 142 and the second wavelength converter 144 can convert wavelengths of light emitted from the light emitting diode chips 120 into different wavelengths. That is, the first wavelength converter 142 and the second wavelength converter 144 may contain different types of phosphors. Accordingly, light having passed through the first wavelength converter 142 may have a different color from light having passed through the second wavelength converter 144.

The light emitting diode package 300 according to this exemplary embodiment can emit various colors through emission of different colors from one package. With such a light emitting diode package 300 applied to a backlight unit, a display apparatus can provide high color reproducibility.

In the light emitting diode package 300, the light emitting diode chips 120 can be independently operated, thereby allowing easy control of color temperature and brightness of the display apparatus corresponding to surrounding environments such as day, night, interior, and exterior environments.

Figure 15:
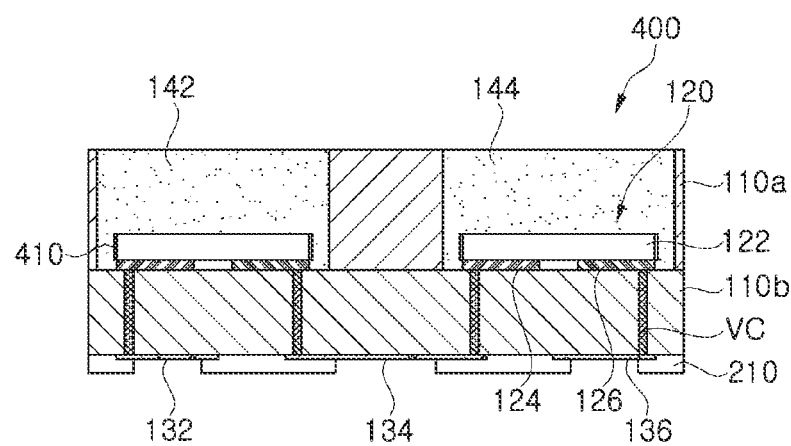
FIG. 15 is a sectional view of a light emitting diode package according to a ninth exemplary embodiment of the disclosed technology.

FIG. 15 is a sectional view of a light emitting diode package according to a ninth exemplary embodiment of the disclosed technology.

Referring to FIG. 15, the light emitting diode package 400 according to the ninth exemplary embodiment includes a reflective layer 410 formed on a side surface of each of the light emitting diode chips 120. The other features of the light emitting diode package 400 according to the ninth exemplary embodiment are the same as those of the light emitting diode package 400 according to the first to eighth exemplary embodiments and description thereof will be omitted.

In some implementations, the reflective layer 410 is formed on sides of each of the light emitting diode chip 120. The reflective layer 410 is formed to surround the side surface of the light emitting diode chip 120.

The reflective layer 410 reflects light emitted through the side surface of the light emitting diode chip 120. The reflective layer 410 prevents the light emitted from the light emitting diode chips 120 from traveling towards a side surface of the housing 110. Accordingly, the reflective layer 410 prevents the light emitting diode package 400 from suffering from light bleeding after passing through the side surface of the housing 110.

In the above exemplary embodiments, heat generated from the light emitting diode chips 120 can be discharged through lower sides of the light emitting diode chips 120 via the electrodes 124, 126, the conductive material filling the via-holes VC, and the first to third electrode pads 132, 134, 136.

In this exemplary embodiment, the reflective layer 410 serves to perform heat dissipation on the side surface of the light emitting diode chip 120. Heat generated from the light emitting diode chips 120 can be transferred to the first and second wavelength converters 142, 144 through the reflective layer 410. Since the reflective layer 410 is formed of a metal having high thermal conductivity, the reflective layer 410 can rapidly transfer the heat from the light emitting diode chips 120 to the first and second wavelength converters 142, 144. The heat transferred to the first and second wavelength converters 142, 144 can be directly discharged from the light emitting diode package 400 or can be discharged therefrom through the housing 110. Thus, the light emitting diode package 400 according to this exemplary embodiment can discharge heat from the light emitting diode chips 120 not only through the lower surface of the light emitting diode chip 120 but also through the side surface thereof.

For example, the reflective layer 410 may have a single layer structure or a multilayer structure including at least one of Ag, Al, Ni, Ti, a distributed Bragg reflector, or an omnidirectional reflector.

As such, in the light emitting diode package 400 according to this exemplary embodiment, the reflective layer 410 formed on the side surface of the light emitting diode chips 120 can prevent a light bleeding phenomenon while improving heat dissipation efficiency.

Figure 16:
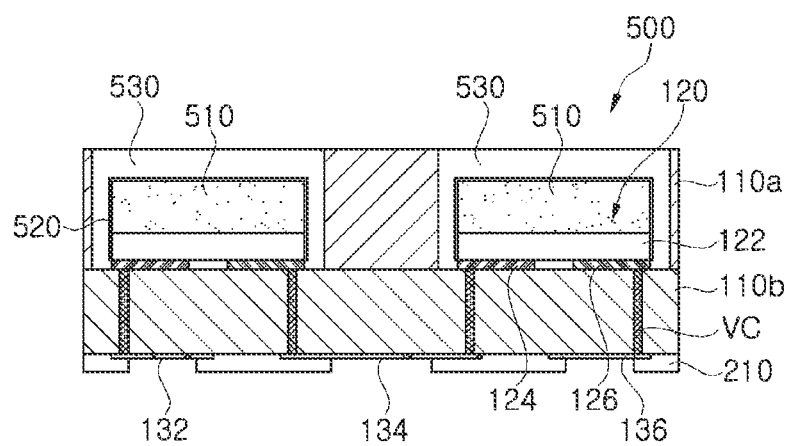
FIG. 16 is a sectional view of a light emitting diode package according to a tenth exemplary embodiment of the disclosed technology.

FIG. 16 is a sectional view of a light emitting diode package according to a tenth exemplary embodiment of the disclosed technology.

Referring to FIG. 16, the light emitting diode package 500 according to the tenth exemplary embodiment includes a housing 110, light emitting diode chips 120, wavelength converters 510, first to third pads 132, 134, 136, an encapsulation portion 530, and surface barriers 520. In the following description, description of the same components as those of the above exemplary embodiments will be omitted.

The wavelength converter 510 is disposed to cover an upper surface of the light emitting diode chip 120. Although not shown in FIG. 16, a bonding agent is interposed between the wavelength converter 510 and the light emitting diode chip 120. In the implementation as shown in FIG. 16, the upper surface of the wavelength converter 510 is located lower than the upper surface of the housing 110.

The encapsulation portion 530 fills the remaining portion of the housing 110 that is not covered by the wavelength converter 510. For example, the encapsulation portion is located between the upper surfaces of the wavelength converter 510 and the housing 110. In the implementation shown in FIG. 16, the encapsulation portion 530 covers side surfaces of the wavelength converters 510 and side surfaces of the light emitting structure 122. The encapsulation portion surrounds the wavelength converters 510 and the light emitting diode chips 120. The encapsulation portion 530 can protect the light emitting diode chips 120 by preventing moisture and dust from entering the housing 110. The encapsulation portion 530 may be formed of an epoxy resin or a silicone resin, which is generally used to seal a light emitting package.

The surface barrier 520 is formed on a side surface of the light emitting diode chip 120 and upper and side surfaces of the wavelength converter 510. The surface barrier 520 can protect the light emitting diode chips 120 and the wavelength converters 510 from the outside. With this structure, the surface barrier 520 can prevent moisture and dust entering the encapsulation portion 530 from entering the light emitting diode chips 120 and the wavelength converter 510.

For example, the surface barrier 520 may be formed of $SiO_2$, $TiO_2$, and the like. The surface barrier 520 may be formed by various methods such as deposition, spraying, sputtering, and the like.

Since the surface barrier 520 has a smoother surface than the light emitting diode chips 120 or the wavelength converters 510, the encapsulation portion 530 has improved flowability. That is, when the housing is filled with a material for the encapsulation portion 530, the material for the encapsulation portion flows along the surface of the surface barrier 520 since the surface barrier 520 has a smooth surface. Accordingly, when the housing is filled with a material for the encapsulation portion 530, it is possible to minimize generation of a gap or bubbles between the surface barrier 520 and the encapsulation portion 530. Thus, the light emitting diode package 500 can have improved light extraction efficiency by minimizing generation of a gap or bubbles between the surface barrier 520 and the encapsulation portion 530.

Since the light emitting diode package 500 according to this exemplary embodiment includes the encapsulation portion 530 and the surface barrier 520 to form a dual structure for blocking penetration of moisture and dust, the light emitting diode package 500 can prevent deterioration in performance of the light emitting diode chips 120 or discoloration of the wavelength converters 510 due to contact with moisture. Accordingly, the light emitting diode package 500 has improved reliability through suppression of failure due to moisture and dust.

Figure 17:
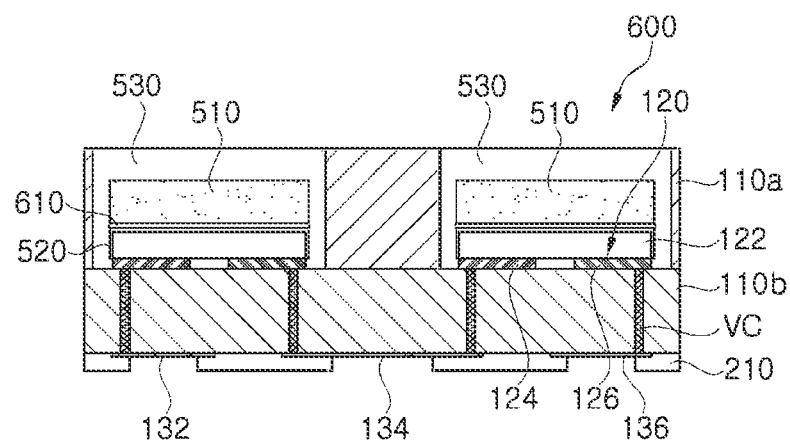
FIG. 17 is a sectional view of a light emitting diode package according to an eleventh exemplary embodiment of the disclosed technology.

FIG. 17 is a sectional view of a light emitting diode package according to an eleventh exemplary embodiment of the disclosed technology.

Referring to FIG. 17, the light emitting diode package 600 according to the eleventh exemplary embodiment includes a housing 110, light emitting diode chips 120, wavelength converters 510, first to third pads 132, 134, 136, an encapsulation portion 530, and surface barriers 520. In the following description, description of the same components as those of the above exemplary embodiments will be omitted.

In this exemplary embodiment, the surface barrier 520 is formed on the upper and side surfaces of the light emitting diode chip 120. For example, a portion of the surface barrier 520 is disposed between the light emitting diode chip 120 and the wavelength converter 510.

A bonding agent 610 is deposited on an upper surface of the surface barrier 520 to bond the light emitting diode chip 120 to the wavelength converter 510.

The surface barrier 520 improves flowability of the bonding agent 610 deposited on the upper surface thereof. As the flowability of the bonding agent 610 is improved, it is possible to prevent generation of bubbles in the bonding agent 610 deposited on the surface barrier 520. Further, the bonding agent 610 may be deposited to have a uniform thickness. Accordingly, the surface barrier 520 can prevent the wavelength converter 510 from being slanted on the light emitting diode chip 120. With this structure, the light emitting diode package 600 can prevent bubble generation in the bonding agent 610, thereby improving adhesion between the wavelength converters 510 and the light emitting diode chips 120. In addition, the light emitting diode package 600 can prevent light traveling toward the wavelength converters 510 from returning back to the light emitting diode chips 120 due to reflection by bubbles in the bonding agent 610. Further, the light emitting diode package 600 includes the bonding agent 610 deposited to a uniform thickness to prevent the wavelength converter 510 from being slanted, thereby enabling uniform wavelength conversion over the entire light exit surface.

Figure 18:
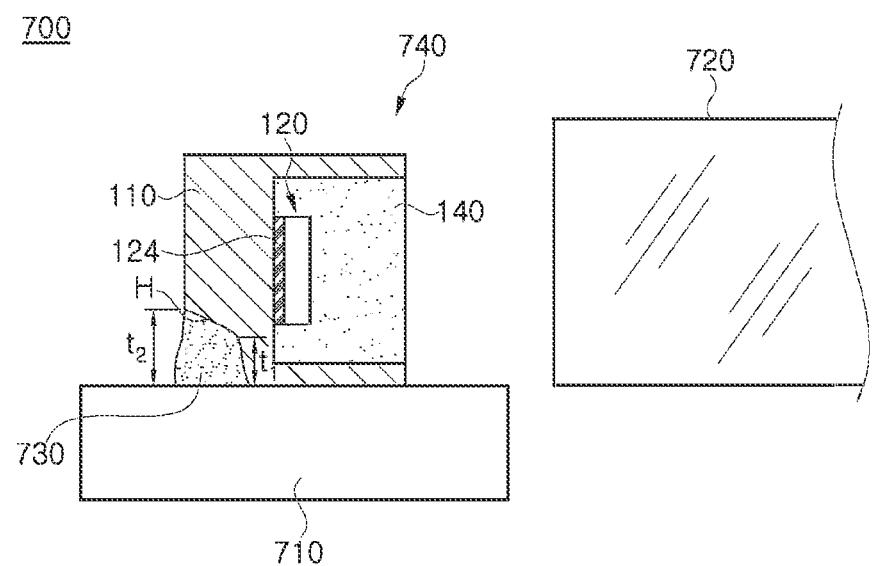
FIG. 18 is a sectional view of a backlight unit according to a first exemplary embodiment of the disclosed technology.

FIG. 18 is a sectional view of a backlight unit according to a first exemplary embodiment of the disclosed technology.

Referring to FIG. 18, the backlight unit 700 according to this exemplary embodiment includes a light emitting diode package 740, a circuit board 710, and a light guide plate 720.

The light emitting diode package 740 is disposed on the circuit board 710. Here, a front surface of the light emitting diode package 740 is perpendicular to an upper surface of the circuit board 710 and a side surface of the light emitting diode package 740 is bonded to the upper surface of the circuit board 710 by a solder 730.

The light emitting diode package 740 may be selected from any light emitting diode packages according to the first to eleventh exemplary embodiments. The solder 730 is deposited on the light emitting diode package 740 to fill grooves H formed in the housing 110. The groove H shown in FIG. 18 is one of the grooves H1 to H4 formed on the pads described in the above exemplary embodiments.

The light guide plate 720 is disposed such that a light incident surface of the light guide plate faces the front surface of the light emitting diode package 740 where the wavelength converter 140 is disposed.

In this exemplary embodiment, the side surface of the light emitting diode package 740 is bonded to the upper surface of the circuit board 710. Accordingly, the backlight unit 700 according to this exemplary embodiment allows light emitted from the light emitting diode package 740 to directly enter the light incident surface of the light guide plate 720 without separate formation of the circuit board 710.

Such a backlight unit 700 does not require a separate formation process, such as bending of the circuit board 710, thereby enabling process simplification and cost reduction.

Although not shown in this exemplary embodiment, the backlight unit 700 may further include other components for a typical backlight unit.

Figure 19:
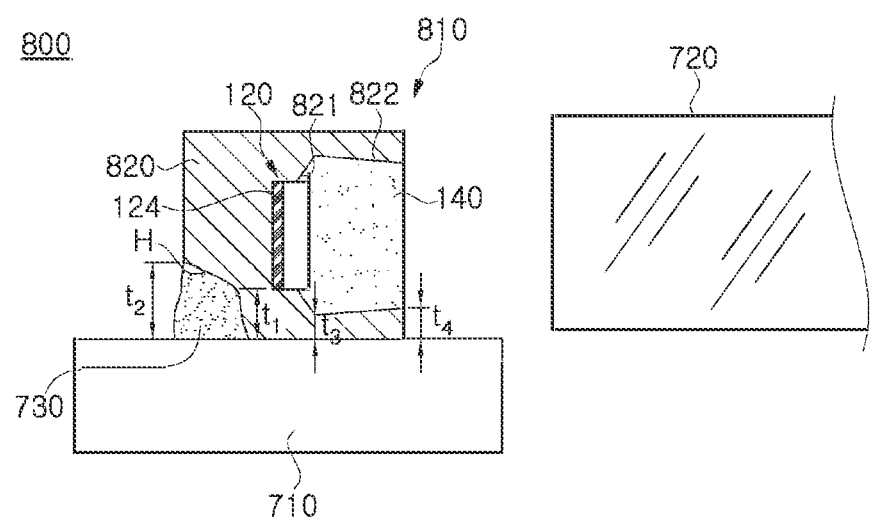
FIG. 19 is a sectional view of a backlight unit according to a second exemplary embodiment of the disclosed technology.

FIG. 19 is a sectional view of a backlight unit according to a second exemplary embodiment of the disclosed technology.

Referring to FIG. 19, the backlight unit 800 according to the second exemplary embodiment includes a light emitting diode package 810, a circuit board 710, and a light guide plate 720. In the following description, description of the same components of the backlight unit 800 according to the first exemplary embodiment will be omitted.

The light emitting diode package 810 according to a twelfth exemplary embodiment includes a housing 820 having a different structure than that of the other exemplary embodiments. The other components of the light emitting diode package 810 according to the twelfth exemplary embodiment are the same as those of the light emitting diode packages according to the first to eleventh exemplary embodiment and thus detailed description thereof will be omitted.

According to this exemplary embodiment, the housing 820 of the light emitting diode package 810 has a recessed inner wall. A central portion of the housing 820 is further recessed from an outer wall of the housing 820. For example, the housing 820 has an inner wall separated from the outer wall of the housing 820 by a varying distance along the inner wall. In the implementation shown in FIG. 19, the central portion of the housing 820 has a smaller thickness t3 than a thickness t4 of an upper portion of the housing 820. The inner wall of the housing 820 has a lower portion 821 and an upper portion 822 such that the lower portion 821 becomes closer to the outer wall of the housing 820 along a direction from the light emitting diode chip 120 toward the upper surface of the housing 820 and that the upper portion 822 becomes further away from the outer wall of the housing 820 along the direction.

The lower portion 821 of the inner wall of the housing 820 partially adjoins a side surface of the light emitting diode chip 120. With this structure, the housing 820 disposed on the side surface of the light emitting diode chip 120 has a large thickness, thereby preventing light emitted from the side surface of the light emitting diode chip 120 from being leaked through the housing 820. In addition, a distance between the other portion of the lower portion 832 of the inner wall of the housing 820 and the side surface of the light emitting diode chip 120 gradually increases. Accordingly, a gap is formed between the side surface of the light emitting diode chips 120 and a portion of the lower portion 821 of the inner wall of the housing 820 and is filled with the wavelength converter 140. The portion of the lower portion 821 of the inner wall of the housing 820 separated from the side surface of the light emitting diode chip 120 may have a flat structure, a concave structure or a convex structure. An upper portion 822 of the inner wall of the housing 820 is connected to the lower portion 821 of the inner wall of the housing 820 to extend to an entrance of an opening of the housing 820. The upper portion 822 of the inner wall of the housing 820 has a flat structure. Alternatively, the upper portion 822 of the inner wall of the housing 820 may have a curved structure such as a convex or concave structure.

Light emitted through the side surface of the light emitting diode chip 120 is reflected by the inner wall of the housing 820. In the structure wherein the inner wall of the housing has a linear structure from an upper side thereof to a lower side thereof, some of light reflected by the inner wall of the housing can travel in other directions instead of traveling to a light exit surface corresponding to the entrance of the opening of the housing 820 of the light emitting diode package 810. However, according to this exemplary embodiment, the recessed inner wall of the housing is formed by the sidewall having different thicknesses t3, t4 at the upper and lower portions thereof such that the housing 820 can reflect light toward the light exit surface of the light emitting diode package 810. Some of light emitted through the side surface of the light emitting diode chip 120 is reflected by the lower portion 821 of the inclined inner wall of the housing 820 so as to be directed toward the light exit surface of the light emitting diode chip. In addition, the upper portion 822 of the inner wall of the housing 820 serves to guide light emitted from the light emitting diode chip 120 and light reflected by the lower portion 821 of the inner wall of the housing 820 to be directed toward the light exit surface.

As such, in the backlight unit 800 according to this exemplary embodiment, light reflected by the recessed inner wall of the housing 820 is guided to travel toward the light incident surface of the light guide plate 720, thereby improving light extraction efficiency.

Although the inner wall of the housing 820 is illustrated as a recessed flat structure in FIG. 19, the inner wall of the housing 820 may have a concavely curved structure.

Figure 20:
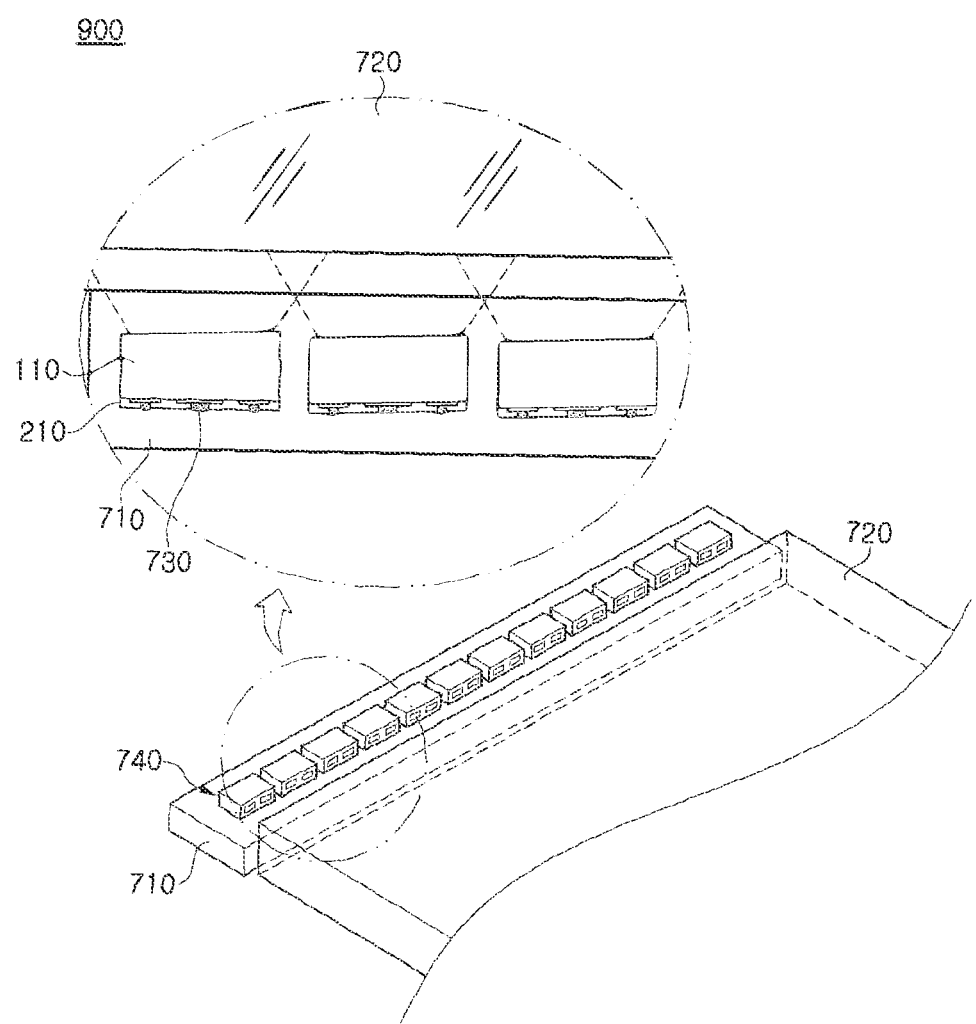
FIG. 20 is a sectional view of a backlight unit according to a third exemplary embodiment of the disclosed technology.

FIG. 20 is a sectional view of a backlight unit according to a third exemplary embodiment of the disclosed technology.

Referring to FIG. 20, the backlight unit 900 according to this exemplary embodiment includes a plurality of light emitting diode packages 740, a circuit board 710, and a light guide plate 720.

Each of the light emitting diode packages 740 includes a protective layer 210 formed on a back surface of a housing 110 thereof.

The plurality of light emitting diode packages 740 may be arranged in a line on an upper surface of the circuit board 710. In addition, the light emitting diode packages 740 are secured to the circuit board 710 by a solder 730. The protective layer 210 prevents the solder 730 deposited on each of the light emitting diode packages 740 from contacting another light emitting diode package 740 adjacent thereto. In some implementations, the solder is deposited on each of the light emitting diode packages 740 by the protective layer.

As such, since short circuit between the light emitting diode packages 740 by the solders 730 is prevented by the protective layer 210, the plurality of light emitting diode packages 740 can be arranged as close as possible.

Since the light emitting diode packages 740 can be arranged as close as possible, a non-luminous region between the light emitting diode packages 740 can be reduced. In addition, the backlight unit 900 according to this exemplary embodiment prevents generation of dark spots between adjacent light emitting diode packages 740 due to intersection of light emitted from the light emitting diode packages 740. Accordingly, the backlight unit 900 allows uniform incidence of light over the entire light incident surface of the light guide plate 720, thereby improving uniformity of light emitted through the light guide plate 720. In addition, since the light emitting diode packages 740 are disposed close to each other, the backlight unit 900 according to this exemplary embodiment allows a greater number of light emitting diode packages 740 to be mounted on the circuit board 710. As such, in the backlight unit 900 according to this exemplary embodiment, the light emitting diode packages 740 are arranged close to each other by the protective layer 210, thereby improving uniformity and brightness of light.

Although some exemplary embodiments have been described herein, it should be understood by those skilled in the art that these exemplary embodiments are given by way of illustration only. In addition, although the exemplary embodiments described herein are provided as separate embodiments, these exemplary embodiments may be combined to provide a separate exemplary embodiment. Therefore, the scope of the present disclosure should be limited only by the accompanying claims and equivalents thereto.

The invention claimed is:
1. A light emitting apparatus, comprising:
a circuit board;
a first light emitter and a second light emitter that are disposed on the circuit board;
a light guide plate including an incident surface receiving light emitted from the first light emitter and the second light emitter; and
a first pad and a second pad that are disposed on the circuit board, the second pad electrically connected to the first light emitter and the second light emitter;
wherein each of the first light emitter and the second light emitter includes:
a light source including Group III-V based layers;
a reflective layer disposed on the light source and including multilayers including at least one of Ag, Al, Ni, Ti, a distributed Bragg reflector, or an omnidirectional reflector;
an encapsulation covering the light source and the reflective layer; and
a housing surrounding the encapsulation.
2. The light emitting apparatus of claim 1,
wherein each of the first light emitter and the second light emitter includes a groove disposed between the housing and the circuit board, the groove including metal material.
3. The light emitting apparatus of claim 2, wherein the groove has a depth and the groove contacts with the housing.
4. The light emitting apparatus of claim 1,
wherein the reflective layer includes a material having high thermal conductivity and reflectivity.
5. The light emitting apparatus of claim 1,
wherein the light source further includes a surface barrier disposed on the light source, and the encapsulation covers the surface barrier including $SiO_2$.
6. The light emitting apparatus of claim 5,
wherein a lower region of the housing has a different thickness from a thickness of an upper region of the housing.
7. The light emitting apparatus of claim 1,
wherein the first light emitter and the second light emitter are electrically connected in series.
8. A light emitting apparatus, comprising:
a circuit board;
a first light emitter and a second light emitter disposed on the circuit board;
a first pad and a second pad that are disposed on the circuit board, the second pad being electrically connected to the first light emitter and the second light emitter; and a light guide plate including an incident surface configured to receive light emitted from the first light emitter and the second light emitter, wherein each of the first light emitter and the second light emitter includes:
- a light source including Group III-V based layers,
- a reflective layer disposed on the light source and including multilayers including at least one of Ag, Al, Ni, Ti, a distributed Bragg reflector, or an omnidirectional reflector,
- an encapsulation covering the light source, and
- a housing surrounding the encapsulation, and wherein the reflective layer is disposed between the light source and the encapsulation.

9. The light emitting apparatus of claim 8, wherein each of the first light emitter and the second light emitter includes a groove disposed between the housing and the circuit board, the groove including metal material.

10. The light emitting apparatus of claim 9, wherein the groove has a depth and the groove contacts with the housing.

11. The light emitting apparatus of claim 8, wherein the reflective layer includes a material having high thermal conductivity and reflectivity.

12. The light emitting apparatus of claim 8, wherein the light source further includes a surface barrier disposed on the light source, and the encapsulation covers the surface barrier including $SiO_2$.

13. The light emitting apparatus of claim 12, wherein a lower region of the housing has a different thickness from a thickness of an upper region of the housing.

14. The light emitting apparatus of claim 8, wherein the first light emitter and the second light emitter are electrically connected in series.

15. A light emitting apparatus, comprising:
a circuit board;
a first light emitter and a second light emitter that are disposed on the circuit board;
a first pad and a second pad that are disposed on the circuit board, the second pad electrically connected to the first light emitter and the second light emitter; and
a light guide plate including an incident surface receiving light emitted from the first light emitter and the second light emitter, wherein each of the first light emitter and the second light emitter includes:
- a light source including an active layer,
- a reflective layer disposed on the light source,
- an encapsulation covering the light source and the reflective layer, the reflective layer including at least one of Ag, Al, Ni, Ti, a distributed Bragg reflector, or an omnidirectional reflector, and
- a housing surrounding the encapsulation.

16. The light emitting apparatus of claim 15, wherein each of the first light emitter and the second light emitter includes a groove disposed between the housing and the circuit board, the groove including metal material.

17. The light emitting apparatus of claim 16, wherein the groove has a depth and the groove contacts with the housing.

18. The light emitting apparatus of claim 15, wherein the reflective layer includes a material having high thermal conductivity and reflectivity, and wherein the first light emitter and the second light emitter are electrically connected in series.

19. The light emitting apparatus of claim 15, wherein the light source further includes a surface barrier disposed on the light source, and the encapsulation covers the surface barrier including $SiO_2$.

20. The light emitting apparatus of claim 19, wherein a lower region of the housing has a different thickness from a thickness of an upper region of the housing.

* * * * *